(12) United States Patent
Cox et al.

(10) Patent No.: US 7,163,747 B2
(45) Date of Patent: Jan. 16, 2007

(54) COMPONENT COMPRISING A MASKING LAYER

(75) Inventors: Nigel-Philip Cox, Berlin (DE); Oliver Dernovsek, München (DE); Ralph Reiche, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/511,250

(22) PCT Filed: Mar. 28, 2003

(86) PCT No.: PCT/EP03/03283

§ 371 (c)(1),
(2), (4) Date: Oct. 8, 2004

(87) PCT Pub. No.: WO03/085163

PCT Pub. Date: Oct. 16, 2003

(65) Prior Publication Data

US 2005/0181222 A1    Aug. 18, 2005

(30) Foreign Application Priority Data

Apr. 10, 2002    (EP) .................. 02008045

(51) Int. Cl.
*B32B 7/10* (2006.01)
*B32B 7/04* (2006.01)
*B32B 15/04* (2006.01)

(52) U.S. Cl. ................. 428/420; 428/411.31; 428/447; 428/448; 428/450

(58) Field of Classification Search ............... None
See application file for complete search history.

(56) References Cited

U.S. PATENT DOCUMENTS

| 3,904,789 | A | * | 9/1975 | Speirs et al. ............... 427/253 |
| 4,128,522 | A | | 12/1978 | Elam |
| 4,181,758 | A | * | 1/1980 | Elam ........................ 427/253 |
| 4,726,104 | A | * | 2/1988 | Foster et al. ............... 29/889.1 |
| 4,845,139 | A | | 7/1989 | Baldi |
| 5,262,466 | A | * | 11/1993 | Baldi ........................ 524/430 |
| 5,867,762 | A | | 2/1999 | Rafferty et al. |
| 6,036,995 | A | * | 3/2000 | Kircher et al. ............. 427/142 |
| 6,110,262 | A | * | 8/2000 | Kircher et al. ............. 106/14.44 |
| 6,253,441 | B1 | * | 7/2001 | Wheat et al. ............... 29/527.2 |
| 6,513,537 | B1 | * | 2/2003 | Orii et al. .................. 134/1.2 |
| 6,521,294 | B1 | * | 2/2003 | Rigney et al. ............. 427/253 |
| 6,884,470 | B1 | * | 4/2005 | Gorman ..................... 427/448 |
| 6,924,038 | B1 | * | 8/2005 | Hardy et al. ............... 428/446 |
| 2001/0007708 | A1 | | 7/2001 | Venkataramani et al. |

FOREIGN PATENT DOCUMENTS

| EP | 0 525 545 B1 | 3/1997 |
| EP | 0 861 919 B1 | 12/2001 |
| GB | 2 210 387 A | 6/1989 |
| JP | 58093866 A | 6/1983 |
| JP | 11181561 A | 7/1999 |
| JP | 2000311870 A | 11/2000 |

* cited by examiner

Primary Examiner—Jennifer C. McNeil
Assistant Examiner—Jason L. Savage

(57) ABSTRACT

Masking layers for components according to the prior art react with the base material of the component and/or are difficult to remove again. The component according to the invention has a masking layer which can very easily be removed following coating of the components, since on the one hand the bonding between the masking layer and the base material of the component is poor, or the masking layer can easily be removed through penetration of a liquid.

19 Claims, 4 Drawing Sheets

US 7,163,747 B2

COMPONENT COMPRISING A MASKING LAYER

CROSS REFERENCE TO RELATED APPLICATIONS

This application is the US National Stage of International Application No. PCT/EP03/03283, filed Mar. 28, 2003 and claims the benefit thereof. The International Application claims the benefits of European application No. 02008045.3 EP filed Apr. 10, 2002, both of the applications are incorporated by reference herein in their entirety.

FIELD OF THE INVENTION

The invention relates generally to a coated component having a masking layer.

BACKGROUND OF THE INVENTION

Components, such as for example turbine blades and vanes, in particular for gas turbines, are coated in particular in the main blade region, since they are exposed to high thermal loads.

Lower temperatures prevail in the base or securing region of the turbine blade or vane, and consequently there is no need for a coating in the form of a thermal barrier coating there. Ceramic coatings are even undesirable in this region, since the base has to be fitted accurately into a metallic disk.

Masks in accordance with the prior art which are intended to prevent coating are often difficult to remove again, since the material of the mask bonds well to the base material of the turbine blade or vane or there is an undesired diffusion of elements out of the masking layer into the base material of the turbine blade or vane.

SUMMARY OF THE INVENTION

Therefore, it is an object of the present invention to provide a masking layer which, following desired coating of the turbine blade or vane, can easily be removed again in the undesired regions without the base material or the geometry of the turbine blade or vane being affected in the masked region.

The object is achieved by a turbine blade or vane as described in the claims. A ceramic is applied direct to the base material of the turbine blade or vane.

Thermal barrier coatings which are applied to a turbine blade or vane in the main blade region generally have intermediate layers between a substrate, i.e. the base material of the turbine blade or vane, and the thermal barrier coating, such as for example what are known as bonding layers, for example metallic MCrAlY, or diffusion barriers.

These intermediate layers are dispensed with at the masking in order to prevent good bonding of the masking layer. The masking layer is formed in particular from ceramic, since the brittle ceramic can be removed by simple processes, such as for example sand blasting, dry ice blasting. The material for the ceramic is selected in such a way that there is little or no diffusion from the ceramic into the substrate.

The object of the invention is also achieved by a turbine blade or vane as described in the claims. The masking layer reacts with the material of the material that is to be applied and is therefore easy to remove.

Further advantageous configurations of the component according to the invention as described in the claims.

DETAILED DESCRIPTION OF THE INVENTION

Figure 1:
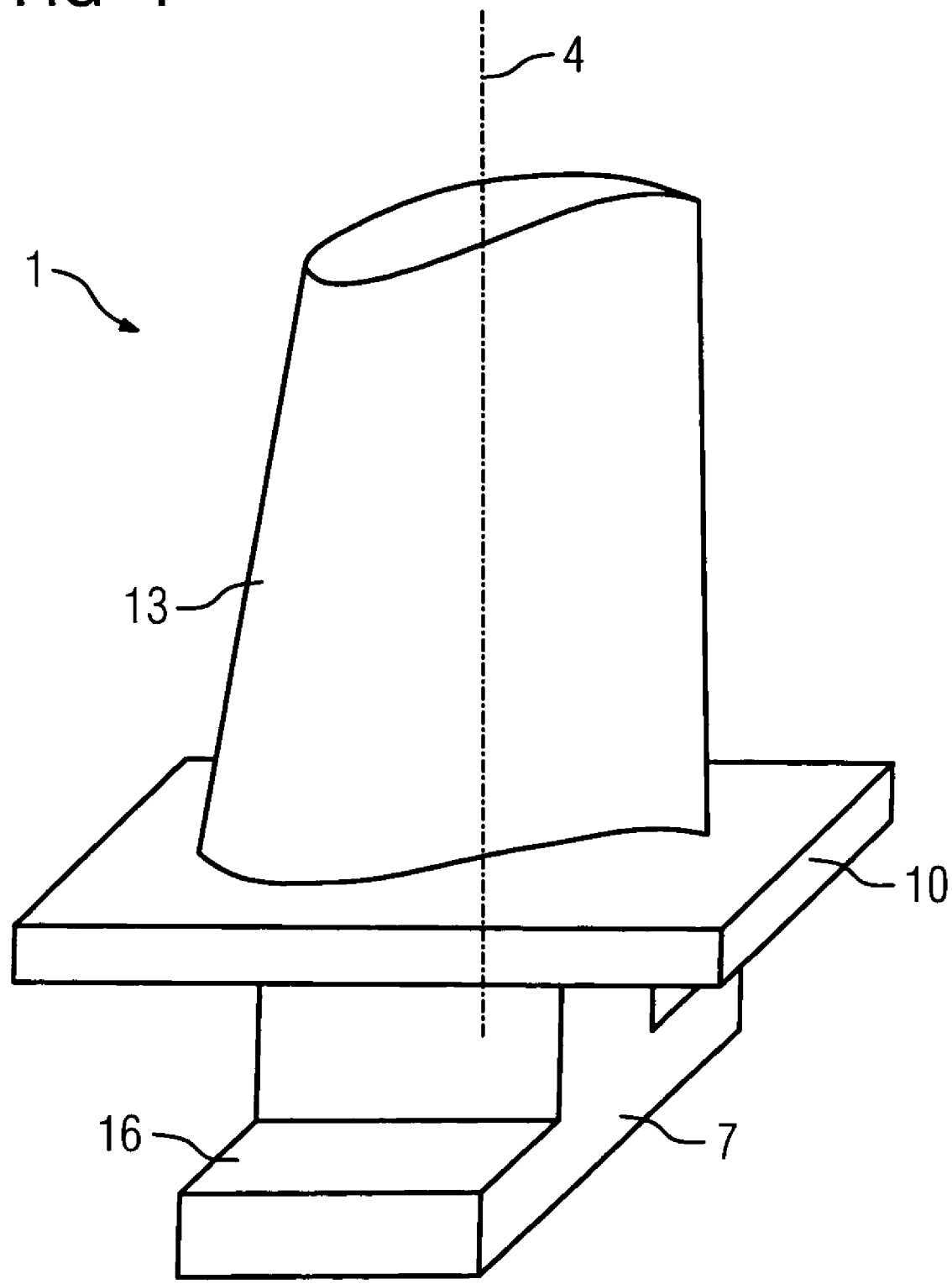
FIG. 1 shows a turbine blade or vane in accordance with the prior art.

Identical reference numerals have the same meaning throughout the various figures.

FIG. 1 shows a perspective view of a turbine blade or vane 1, in particular a rotor blade for a gas turbine, which extends along a longitudinal axis 4. In succession along the longitudinal axis 4, the turbine blade 1 has a securing region 7, an adjoining blade platform 10 and a main blade region 13.

The securing region 7 is designed as a blade root 16 which is used to secure the turbine blade 1 to a shaft (not shown in more detail) of a turbine machine (likewise not shown in more detail). The blade root 16 is designed, for example, in the form of a hammerhead. Other configurations, for example as a fir-tree root or dovetail root are also possible.

In conventional turbine blades 1, solid metallic materials, in particular nickel- or cobalt-base superalloys, are used in all regions of the turbine blade. The turbine blade may in this case be produced by a casting process, by a forging process, by a milling process or by combinations of the above.

In particular the securing region 7 is made from metal, since this region is clamped in an accurately fitting manner into a corresponding shape in a disk. Brittle ceramic coatings would flake off and alter the geometry in the securing region.

The main blade region 13 is coated, for example, with a thermal barrier coating, it being possible for further layers, such as for example bonding layers (MCrAlY layers), to be arranged between the base material of the turbine blade 1.

A component according to the invention in the form of a turbine blade or vane 1 may be a guide vane or rotor blade of any desired turbine, in particular a steam or gas turbine.

Figure 2:
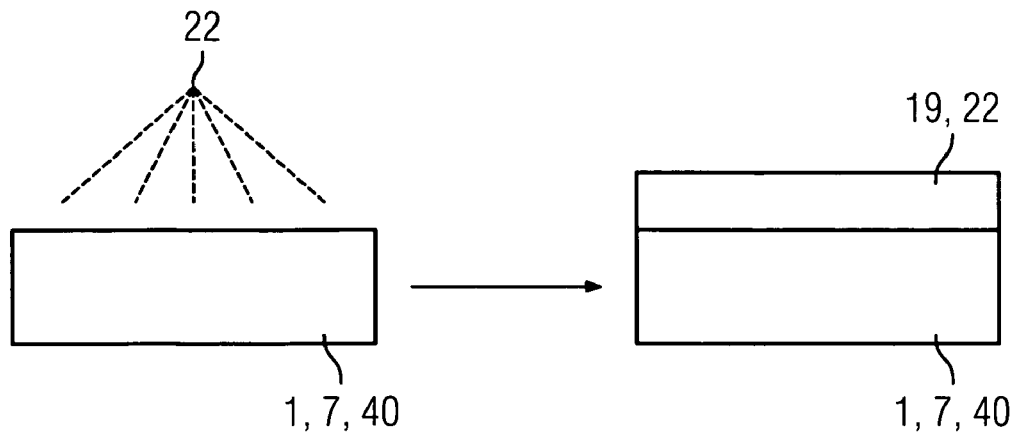
FIG. 2 shows process steps involved in the production of a coating in accordance with the prior art.
Figure 3:
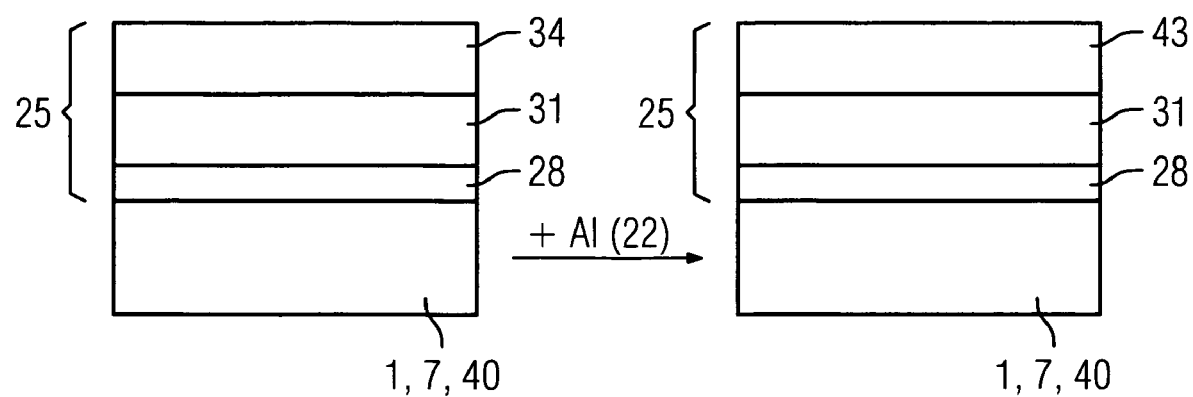
FIG. 3 shows a masking layer of a turbine blade or vane according to the invention.

FIG. 2 shows what happens when the surface of the blade 1 does not have a masking layer 25 (FIG. 3). The material 22 of an interlayer 19 (MCrAlY), which has been applied in any desired form to a surface of the turbine blade 1, for example by plasma spraying, by PVD or CVD or by dipping in a liquid metal or application of powder, so as to form the interlayer 19, leads to a reaction of the material 22 with the turbine blade 1 and to good bonding of the interlayer 19 to the base material of the turbine blade 1.

When the interlayer 19 is to be removed again, for example because it is undesired in the securing region 7, it therefore presents considerable problems, since the geometry of the securing region 7 changes as a result of partial removal of the base material of the substrate 40.

FIG. 3 shows a component according to the invention in the form of a turbine blade 1 with a masking layer 25. By way of example, first of all a first functional layer 28 is applied to the turbine blade 1. This first functional layer is, for example, a polycarbosilane layer with a thickness in the nanometer range, which crosslinks at 200° C. in air, allowing good bonding to the base material 40 of the turbine blade 1.

By way of example, a gradient layer 31 is applied to the first functional layer 28, the material used for the gradient layer 31 being a mixture of polysiloxane and a metal-ceramic and/or metal.

The gradient layer 31 may, for example, be applied in the form of a slip with layer thicknesses of 10–30 μm and can likewise be crosslinked at approximately 200° C. in air.

A further powder, in particular of the composition MCrAlY, where M stands for Fe, Co, Ni, is added as a metallic filler to this material of the gradient layer 31, since such a filler, on account of its expansion coefficient, is used as an interlayer (bonding layer) between base material 40 and ceramic thermal barrier coating.

A reactive layer 34, consisting, for example, of a pure carbon precursor, is applied to the gradient layer. The crosslinking within the reactive layer 34 takes place at 180° C. in air.

The crosslinked layers 28, 31, 34 are converted into a ceramic by what is known as the pyrolysis process as a result of a heat treatment at 1000° C. under an argon atmosphere. On account of the change in density of the organometallic precursor, such as for example the polysiloxane, having a density of 1 g/cm$^3$, to a silicon oxicarbide phase (SiOC) with a density of approx. 2.3 g/cm$^3$, a 10–30 μm thick, dense and crack-free coating is not possible. Therefore, metallic or ceramic fillers are added to the polymer, for example in a proportion of 30–50% by volume, in order to deliberately control the phase transformation of the polymer and the crack formation which are taking place and to minimize or eliminate the thermomechanical stresses caused by different coefficients of thermal expansion at the interface between metal (turbine blade 1) and masking layer 25.

The required thermal stability of the masking layer is provided by the thermal phase transformation of the polycarbosilane into the corresponding high-temperature-resistant SiOC or graphite phase.

During the coating process, a material 22 is applied to the main blade region 13 of the turbine blade 1 and to the masking layer 25. The material 22 reacts with the reactive layer 34 to form a reaction layer 43, i.e. to form a material which is able to withstand high temperatures but, for example, is soluble in water, i.e. can easily be removed.

The material 22 is, for example, aluminum, which is applied to the turbine blade 1 in order to form an aluminide layer. An aluminide layer of this type can be applied by plasma spraying or processes as described in EP patent 0 525 545 B1 and EP patent 0 861 919 B1.

In the case of aluminum, the carbon of the reactive layer 34 reacts with aluminum to form $Al_4C_3$. If the main blade region 13 is completely coated, the entire blade, in particular the securing region 7, can be introduced into water, with the result that the water-soluble reaction layer 43 which has reacted with the material 22 is dissolved.

The underlying layers 28, 31 can easily be removed by dry ice blasting, and consequently the removal processes do not cause any change in the geometry in the securing region 7. Aluminum is applied to a turbine blade 1 during refurbishment for example, i.e. inter alia during removal of used MCrAlY layers.

As an alternative to the three-layer structure shown here by way of example, the masking layer 25 may also be a gradient layer which has a graduated structure, i.e. on the substrate 40 the composition is selected in such a way as to allow good bonding, and at the outer surface the composition is such that it reacts with the material 22 of layers which are yet to be applied.

Figure 4:
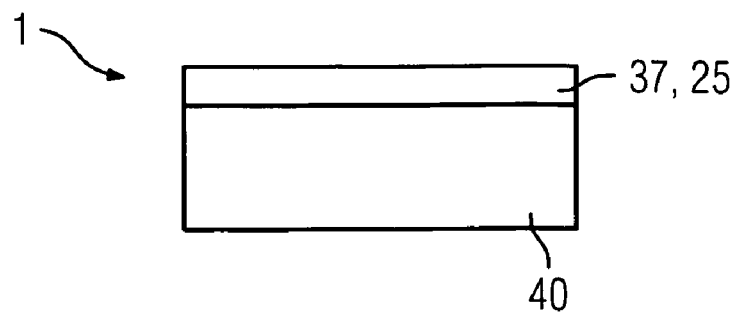
FIG. 4 shows a further masking layer of a turbine blade or vane according to the invention.

FIG. 4 shows a component according to the invention in the form of a turbine blade 1 having a masking layer 25.

A ceramic layer 37, which forms the masking layer 25, is applied direct to the, for example, metallic turbine blade 1.

This ceramic layer may, for example, be an oxide ceramic which is matched to the coefficient of thermal expansion of the substrate.

There are no further layers, in particular no bonding layers, between the ceramic layer 37 and the metallic substrate 40 of the turbine blade 1, and consequently the ceramic layer 25, 37 can be removed by gentle introduction of energy, such as for example sand blasting or dry ice blasting. The dense ceramic layer 37 also forms a diffusion barrier during a process of coating the turbine blade 1 with other layers, such as for example bonding layers or thermal barrier coatings.

The masking layer 25 may also only react with the material 22 of layers which are yet to be applied, for example to form a brittle layer 43, for example a ceramic layer 37. The ceramic layer 37 may also form only after a further heat treatment (pyrolysis), by way of example.

Brittle layers 43 of this type can be removed by simple processes, such as thermal shock processes or sand blasting or dry ice blasting, i.e. by blasting processes which introduce energy but do not have an abrasive action.

It is particularly advantageous if the masking layer 25 reacts with the material 22 of layers which are to be applied to form a water-soluble layer 43.

Further layers may in this case be present beneath the top layer of the masking layer, i.e. the masking layer 25 may be a multilayer structure. In this case, it is possible for a joining layer to be applied direct to the substrate 40 of the coated component and for a gradient layer also to be applied, allowing matching to coefficients of thermal expansion, so that the masking layer 25 remains crack-free even during masking, and consequently it is impossible for any material to reach the substrate 40 of the component which is to be coated.

Figure 5:
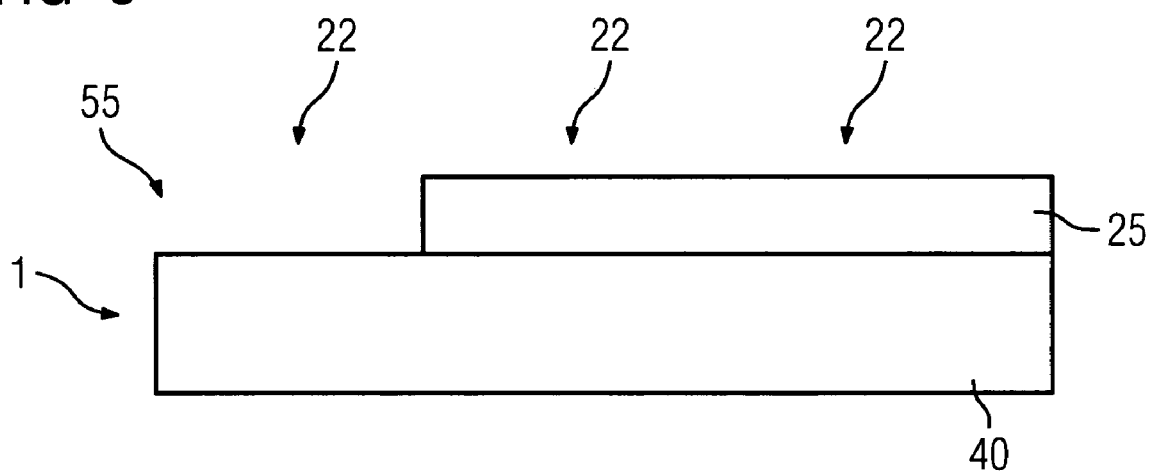
FIGS. 5, 6 show a masking layer which reacts with material of layers which are to be applied.

FIG. 5 shows a turbine blade 1 having a substrate 40 to which a masking layer 25 has been applied. The material of the masking layer does not react and diffuse with the material of the substrate 40 at the elevated temperatures of the coating process.

Figure 6:
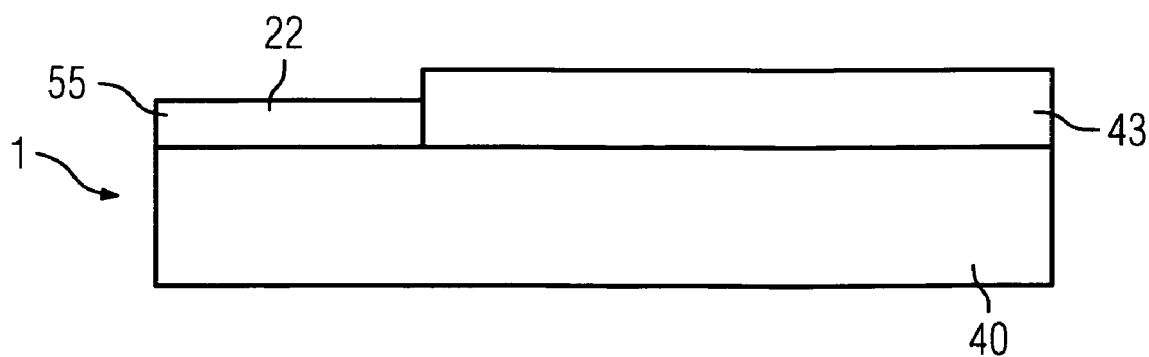

During the coating process, material 22 comes into contact with the masking layer 25 and reacts with the latter. The reaction may also take place in a subsequent heat treatment, if the reaction temperature is higher than the substrate temperature during the coating operation. The reaction layer 43 which is formed in this way (FIG. 6) can easily be removed again following the process of coating the turbine blade, since it is, for example, brittle or water-soluble. The material 22 therefore also comes into contact with the unmasked regions of the substrate 40 of the turbine blade 1 and forms a desired coating 55 (FIG. 6).

Figure 7:
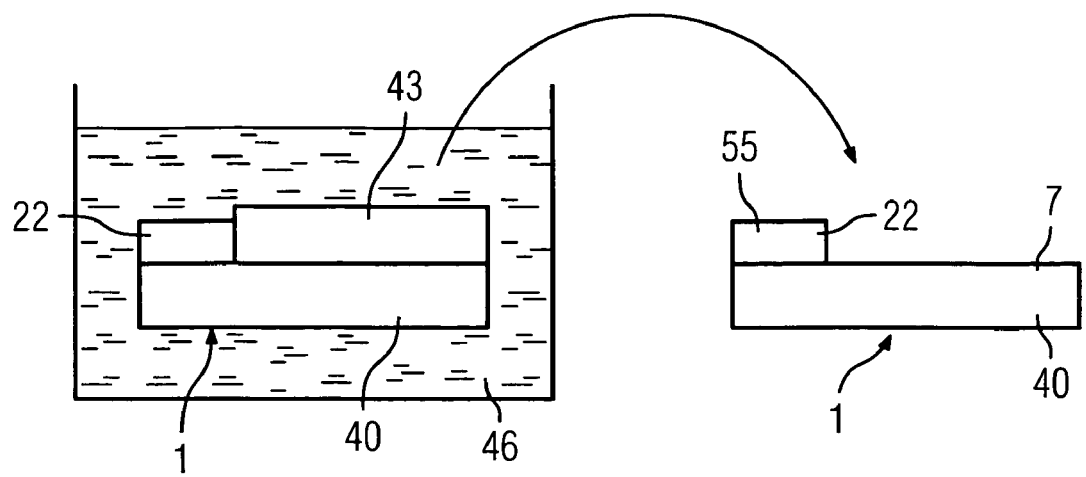
FIGS. 7, 8 show how the masking layer can easily be removed again following a reaction.

FIG. 7 shows a water bath 46 into which a turbine blade having a water-soluble layer 43 has been introduced. Its water solubility allows the layer 43 to be removed easily, so that after the turbine blade 1 has been taken out of the water bath an uncoated part and a desired coated part 55 of the turbine blade 1 are present. The reaction layer 43 may also be removed by water blasting, in which case once again a small amount of energy is introduced.

Figure 8:
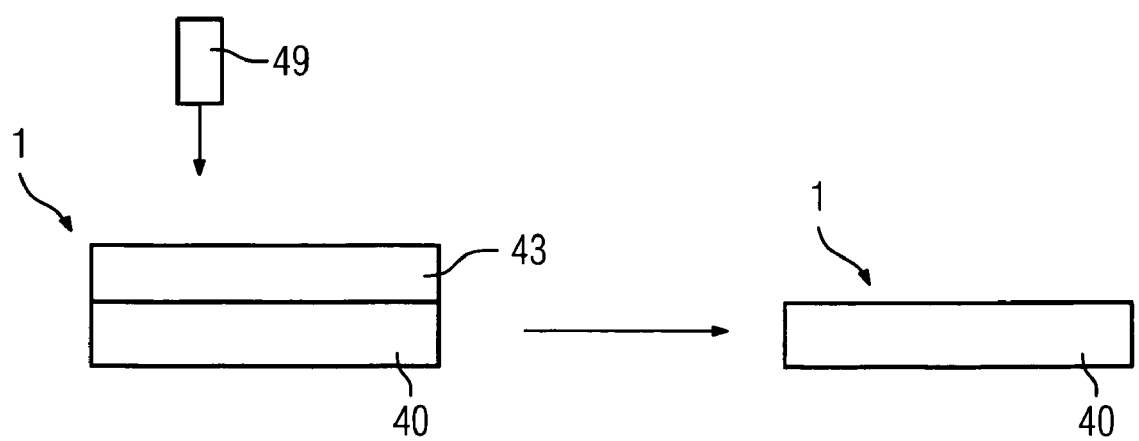

The, for example, brittle reaction layer 43 may also be removed by the introduction of energy from a blasting gun 49 (ultrasound, dry ice blaster, sand blaster) (FIG. 8).

The invention claimed is:

1. A turbine component, comprising:
    a masking layer arranged on a portion of the component; and
    a plurality of material layers arranged on the component,
    wherein one of the material layers is a thermal barrier coating layer applied to the masking layer and a portion of the thermal barrier coating layer and a portion of the masking layer chemically react to form a water soluble layer.

2. The turbine component as claimed in claim 1, wherein the turbine component is a blade or vane.

3. The turbine component as claimed in claim 1, wherein the thermal barrier coating comprises a bond coat.

4. The turbine component as claimed in claim 1, wherein the masking layer comprises carbon arranged on the outer surface of the masking layer.

5. The turbine component as claimed in claim 4, wherein the reaction additionally provides a ceramic layer.

6. The turbine component as claimed in claim 1, wherein the masking layer comprises three sub-layers,
    a first sub-layer is arranged on a base material of the component and provides bonding to the base material of the component,
    a second gradient sub-layer arranged on the first sub-layer, and
    a third reactive sub-layer arranged on the gradient layer and adapted to react with the layers of material applied to the component.

7. The turbine component as claimed in claim 6, wherein the first sub-layer comprises carbosilane.

8. The turbine component as claimed in claim 6, wherein the gradient layer comprises polysiloxane, a metal, or a metal-ceramic composite.

9. The turbine component as claimed in claim 6, wherein the gradient layer comprises polysiloxane, the metal, and a metal-ceramic composite.

10. The turbine component as claimed in claim 6, wherein a filler material is added to the gradient sub-layer to inhibit thermo-mechanical stresses in the masking layer.

11. The turbine component as claimed in claim 10, wherein a filler material is added to the gradient sub-layer to prevent thermo-mechanical stresses in the masking layer.

12. The turbine component as claimed in claim 6, wherein a filler material is added to the gradient sub-layer to inhibit thermo-mechanical stresses between the masking layer and a substrate of the component.

13. The component as claimed in claim 1, wherein the masking layer is a gradient layer.

14. A turbine blade or vane, comprising:
    a substrate;
    a masking layer applied to the substrate; and
    a thermal barrier coating layer applied to the masking layer, wherein
    a portion of the thermal barrier coating layer and a portion of the masking layer chemically reacts to form a water soluble layer.

15. The turbine blade or vane as claimed in claim 14, wherein the masking layer is comprised of a fist sub-layer applied to the substrate, a gradient sub-layer applied to the first sub-layer, and a third reactive sub-layer applied to the gradient sub-layer.

16. The turbine component as claimed in claim 15, wherein the third sub-layer reacts with the thermal barrier coating layer to form the water soluble layer.

17. The turbine component as claimed in claim 15, wherein the first sub-layer comprises carbosilane.

18. The turbine component as claimed in claim 15, wherein the gradient layer comprises polysiloxane, a metal, and a metal-ceramic composite.

19. The turbine component as claimed in claim 15, wherein the masking layer is applied to a portion of the substrate.

* * * * *